(12) United States Patent
Isshiki et al.

(10) Patent No.: US 6,620,001 B2
(45) Date of Patent: Sep. 16, 2003

(54) CONNECTOR FOR A CIRCUIT BOARD

(75) Inventors: Yoshihiro Isshiki, Yokkaichi (JP);
Kouichi Shirouzu, Nishikamo-gun (JP)

(73) Assignees: Sumitomo Wiring Systems, Ltd., Mie (JP); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 09/842,690

(22) Filed: Apr. 27, 2001

(65) Prior Publication Data

US 2001/0051451 A1 Dec. 13, 2001

(30) Foreign Application Priority Data

May 23, 2000 (JP) .......................................... 2000-151163

(51) Int. Cl.$^7$ ............................................. H01R 13/187
(52) U.S. Cl. ........................................ 439/844; 439/248
(58) Field of Search .......................... 439/78, 79, 247, 439/248, 752, 81, 82, 83, 844

(56) References Cited

U.S. PATENT DOCUMENTS

| 4,722,691 A | 2/1988 | Gladd et al. |
| 5,713,745 A | 2/1998 | Sakurai et al. ................ 439/78 |
| 5,827,076 A | 10/1998 | Chen |
| 6,244,909 B1 * | 6/2001 | Okada et al. ............... 439/844 |

FOREIGN PATENT DOCUMENTS

EP            0 639 873 A       2/1995

* cited by examiner

*Primary Examiner*—Alexander Gilman
(74) *Attorney, Agent, or Firm*—Oliff & Berridge, PLC

(57) ABSTRACT

In a connector for a circuit board, an engaging groove 27 for adjusting alignment of board connecting pins 17 in the longitudinal direction of a circuit board connecter 12 is formed in a housing 14. A retainer 21 is attached to a surface of the housing 14 from which the board connecting pins 17 are projected. A slit 30 for adjusting the alignment of the board connecting pins 17 in the widthwise direction of the board connector 12 is formed in the retainer 21.

4 Claims, 5 Drawing Sheets

CONNECTOR FOR A CIRCUIT BOARD

BACKGROUND OF THE INVENTION

1. Field of the Invention

The present invention relates to a circuit board connector to be provided on a circuit board.

2. Description of the Related Art

Generally, a circuit board connector has a housing fixed to a circuit board, which accommodates terminals. A board connecting pin formed on each of the terminals is projected from a bottom opening portion of the housing to the outside. Further, each of the board connecting pins is inserted into a corresponding mounting hole formed in the circuitboard. Then, an inserted part of each of the board connecting pints is soldered thereto. Thus, the circuit board connector is electrically connected to the circuit board.

Meanwhile, when the board connector is mounted on the circuit board, a leading end of the board connecting pin may interfere with and be caught on the inner peripheral surface of the mounting hole of the circuit board. Further, after the board connecting pins are soldered thereto, fitting resistance to the terminal of the board connector is sometimes caused owing to a board connecting portion of the counterpart connector of the board connector, so that the terminal is slightly moved. Thus, to eliminate such inconvenience, a V-bent elastic flexible portion is formed on each of the board connecting pins. Elastic deformation of this flexible portion serves to prevent excessive stress from being exerted on the board connecting pins, and to prevent solder cracks from occurring therein.

However, because of the elongated shape of each of the board connecting pins, it is difficult to bend and form the elastic flexible portion with high accuracy. Thus, when the board connector is set on the circuitboard, misalignment between the board connecting pin and the corresponding mounting hole occurs. Therefore, to eliminate such inconvenience, a retainer for positioning the board connecting pins at regular positions thereof is attached to the housing. Moreover, the board connector is mounted on the circuit board after the retainer is attached to the housing and the alignment of the board connecting pins is adjusted.

However, generally, materials forming the housing and the retainer are PBT (polybutylene terephthalate) and largely differ in coefficient of thermal expansion from the circuit board made of a glass epoxy resin. Therefore, this conventional board connector has a drawback in that displacement of the board connecting pin is easy to occur when the housing, the retainer, and the circuit board respectively expand and contract by different amounts owing to heat generated in the external environment and components mounted on a junction block.

Thus, it has been considered that the housing and the retainer are made of a material whose coefficients of thermal expansion are close to that of the material of the circuit board. To put it concretely, such a material is PBT to which glass is mixed (that is, PBT-G). However, when this material is employed, the aforementioned inconvenience is solved, while there is caused another drawback in that the connecting portion between the retainer and the housing is easy to break because both materials of the housing and the retainer are hard.

SUMMARY OF THE INVENTION

The present invention is accomplished in view of the aforementioned drawbacks, and therefore an object of the invention is to provide a board connector that can secure the function of adjusting the alignment of the board connecting portion and that enables the assembly of the housing and the retainer without causing damage thereto.

To achieve the foregoing object, according to a first aspect of the invention, there is provided a connector for a circuit board, which has terminals accommodated in a housing to be fixed to a circuit board, and board connecting portions each including an elastic flexible portion formed on each of the terminals. A leading end portion of each of the board connecting portions, which is projected from the housing, is fixed to the circuit board. This connector comprises a retainer attached to a side face, from which a corresponding one of the board connecting portions is projected, of the housing. A first adjusting portion for adjusting alignment of the board connecting portion in a predetermined direction is provided in the housing. A second adjusting portion for adjusting alignment of the board connecting portions in a direction orthogonal to the predetermined direction is provided in the retainer.

According to a second aspect of the invention, in the connector according to the first aspect of the invention, one of the housing and the retainer is mounted on the circuit board by being in contact therewith, and made of a material whose coefficient of thermal expansion is nearly equal to that of thermal expansion of a material of the circuit board.

According to a third aspect of the invention, in the connector according to the first aspect of the invention, one of the first adjusting portion and the second adjusting portion is used for adjusting alignment of the board connecting portion in a longitudinal direction of a connector body. Moreover, the one of the housing and the retainer is made of a material whose coefficient of thermal expansion is nearly equal to that of thermal expansion of a material of the circuit board.

According to a fourth aspect of the invention, in the connector according to any one of the first to third aspects of the invention, the second adjusting portion is a slit extending in a longitudinal direction of the retainer.

According to a fifth aspect of the invention, in the connector according to any one of the first to fourth aspects of the invention, the first adjusting portion is an engaging groove with which both side parts of the elastic flexible portion are engaged in a state in which both the side parts abut against the engaging groove.

According to the first aspect of the invention, the alignment of the board connecting portions is adjusted in a predetermined direction by the first adjusting portion. Moreover, the alignment of the board connecting portions in a direction orthogonal to the predetermined direction is adjusted by the second adjusting portion. In short, the board connecting portions can be positioned at regular positions by both the adjusting portions. Therefore, even when one of the housing and the retainer employs a soft material, that is, a material differing in coefficient of thermal expansion from the circuit board, it is sufficient to adjust only the alignment in a direction in which the expansion or contraction of the circuit board is small. Thus, the housing and the retainer can be incorporated thereinto without being damaged, while the function of adjusting the alignment of the board connecting portions is secured.

According to the second aspect of the invention, one of the housing and the retainer, which are in contact with the circuit board, is formed from a material whose coefficient of thermal expansion is nearly equal to that of thermal expansion of the material of the circuit board. Thus, the displacement of the board connecting portions can be prevented from being caused as the housing, the retainer, and the circuitboard expand and contract by different amounts, respectively. Consequently, an occurrence of semiconductor cracks can be reliably prevented.

According to the third aspect of the invention, one of the housing and the retainer, which are used for adjusting the alignment of the board connecting portions in the longitudinal direction of the connector body, is formed from a material whose coefficient of thermal expansion is nearly equal to that of thermal expansion of the circuit board. This results in reduction in an amount, by which the housing or the retainer expands and contracts in the longitudinal direction of the connector body owing to heat generated in the external environment and generated by components mounted on a junction block.

According to the fourth aspect of the invention, the second adjusting portion is a slit extending in the longitudinal direction of the retainer. Thus, the board connecting portions can easily be inserted into the slit. Consequently, the retainer can easily be attached to the housing.

According to the fifth aspect of the invention, the first adjusting portion is an engaging groove with which an elastic flexible portion is engaged. Thus, although the first adjusting portion has a simple shape, the first adjusting portion can reliably prevent the displacement of the board connecting portions.

DETAILED DESCRIPTION OF THE PREFERRED EMBODIMENTS

Hereinafter, an embodiment embodying the invention is described in detail with reference to the accompanying drawings.

Figure 1:
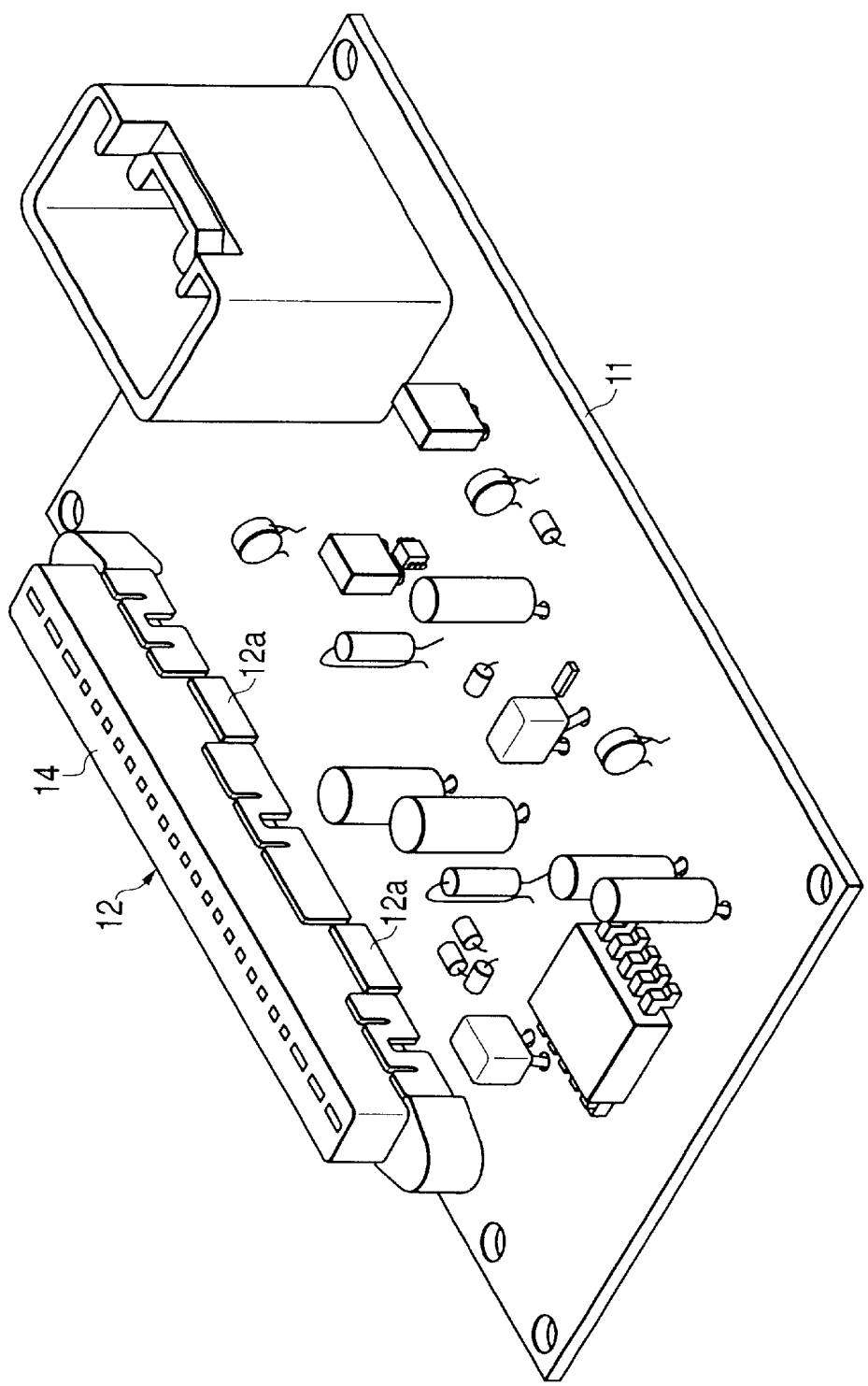
FIG. 1 is a perspective view of a board connector mounted on a circuit board according to an embodiment of the invention.
Figure 2:
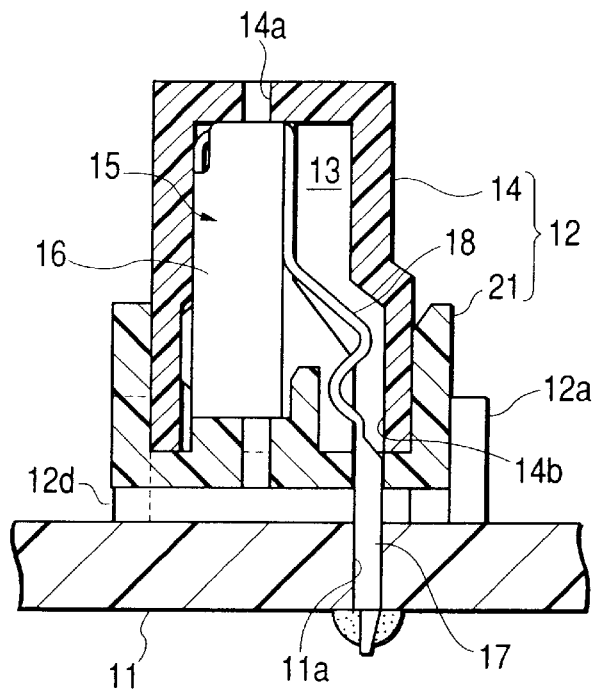
FIG. 2 is an enlarged sectional view of the connector of FIG. 1.

As shown in FIGS. 1 and 2, an elongated connector 12 for a circuit board is disposed on a circuit board 11. The connector 12 has a housing 14, whose top portion is divided into many terminal accommodating portions 13 formed therein. The housing 14 is supported through a plurality of support legs 12a. Further, the housing 14 has both longitudinal end portions fixed to the circuit board 11 by using screws (not shown). A material forming the housing is PBT-G obtained by mixing glass into PBT (polybutylene terephthalate). The purpose of employing this material is to make the coefficient of thermal expansion of the housing 14 nearly equal to that of thermal expansion of the circuit board 11 made of glass epoxy resin.

A single female terminal 15 is accommodated in each of the terminal accommodating portions 13. The female terminal 15 consists of a fitting portion 16 formed like a cylinder having a longitudinal rectangular section, and a board connecting pin 17 that is provided on a side face of the fitting portion 16 and that serves as a board connecting portion. A top insertion hole 14a is formed at a position located above the fitting portion 16 in the housing 14. A male connector (not shown) provided in the counterpart connector is inserted into and connected to the fitting portion 16 through this top insertion hole 14a.

A leading end portion of the board connecting pin 17 is protruded therefrom to the outside through a bottom opening portion 14b of the housing 14, and inserted into a mounting hole 11a formed in the circuit board 11. Further, the female terminal 15 is electrically connected to the circuit board 11 by soldering the leading end portion of the board connecting pin 17 thereto. An elastic flexible portion 18, whose nearly central portion is bend like a letter "V", is formed in the board connecting pin 17. Furthermore, elastic deformation of this elastic flexible portion 18 prevents excessive stress from being externally caused in the female terminal 15.

Figure 3:
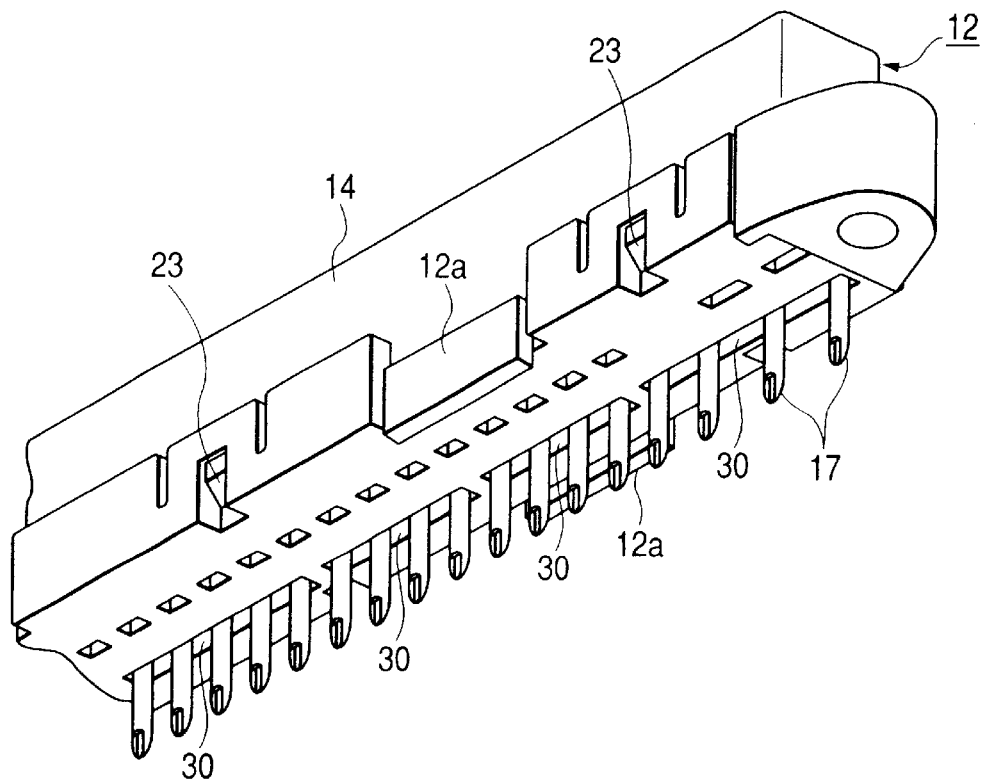
FIG. 3 is a perspective view of the board connector and a retainer, which are viewed from below.
Figure 4:
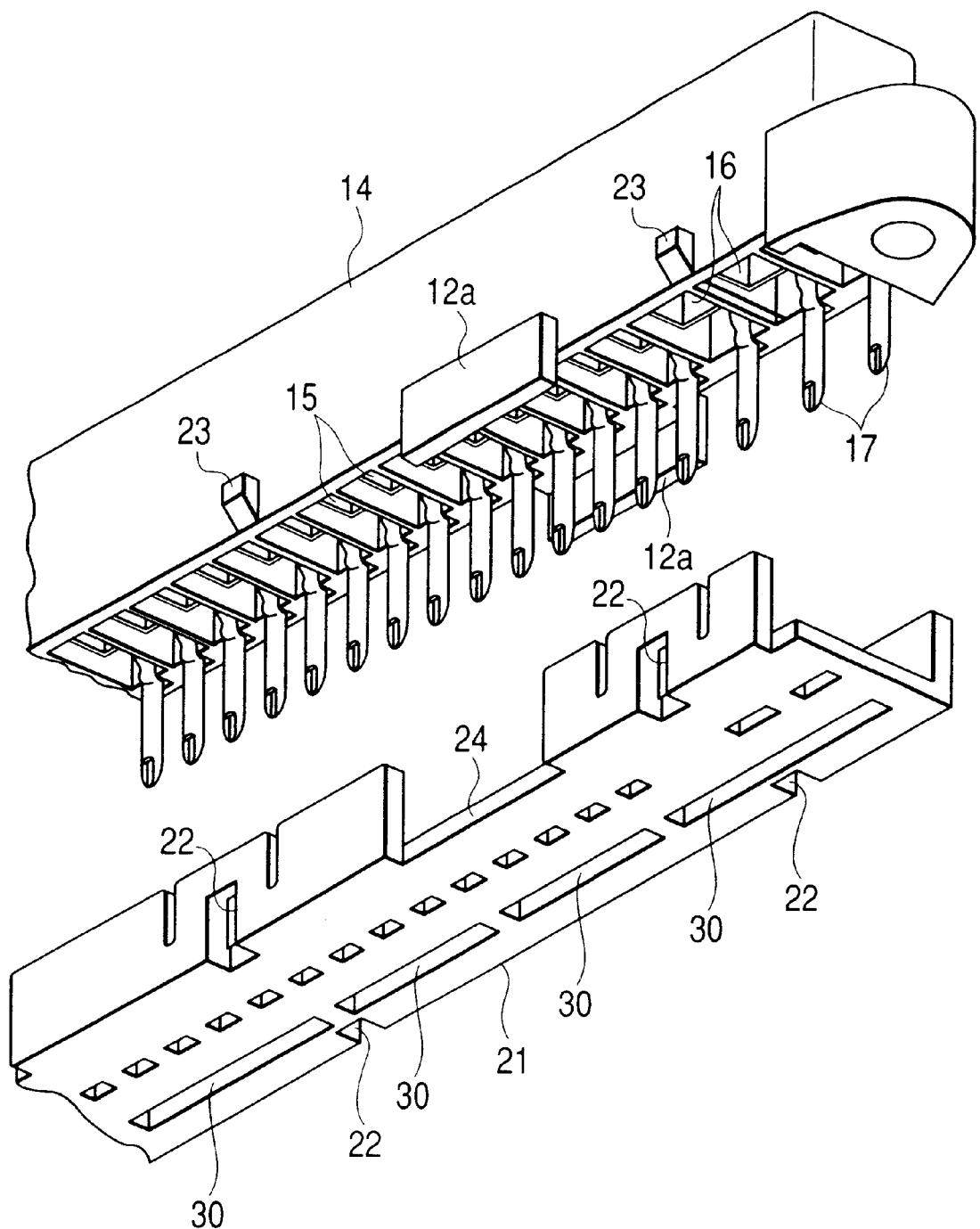
FIG. 4 is an exploded perspective view of the connector and the retainer of FIG. 3.

As shown in FIGS. 2 to 4, a retainer 21 having a concave section is provided apart from the circuit board 11 on the side face, from which the board connecting pins 17 are projected, of the housing 14, that is, on the bottom surface of the housing 14. A material for forming the retainer 21 is PBT. Therefore, the retainer 21 is softer than the housing 14.

A plurality of latch holes 22 are formed in both longitudinal side portions of the retainer 21. Each of latch projections 23 formed on both side surfaces of the housing 14 is disengageably engaged with a corresponding one of the latch holes 22. The connector is adapted so that the retainer 21 is attached to the housing 14 by engaging the latch hole 22 with the latch projection 23. A cutout portion 24 is formed at a place between the adjacent latch portion 24 in the retainer 21. This cutout portion 24 serves to prevent the retainer 21 from hitting the support legs 12a when the retainer 21 is attached thereto.

Subsequently, a primary portion of this embodiment will be described below.

Figure 5:
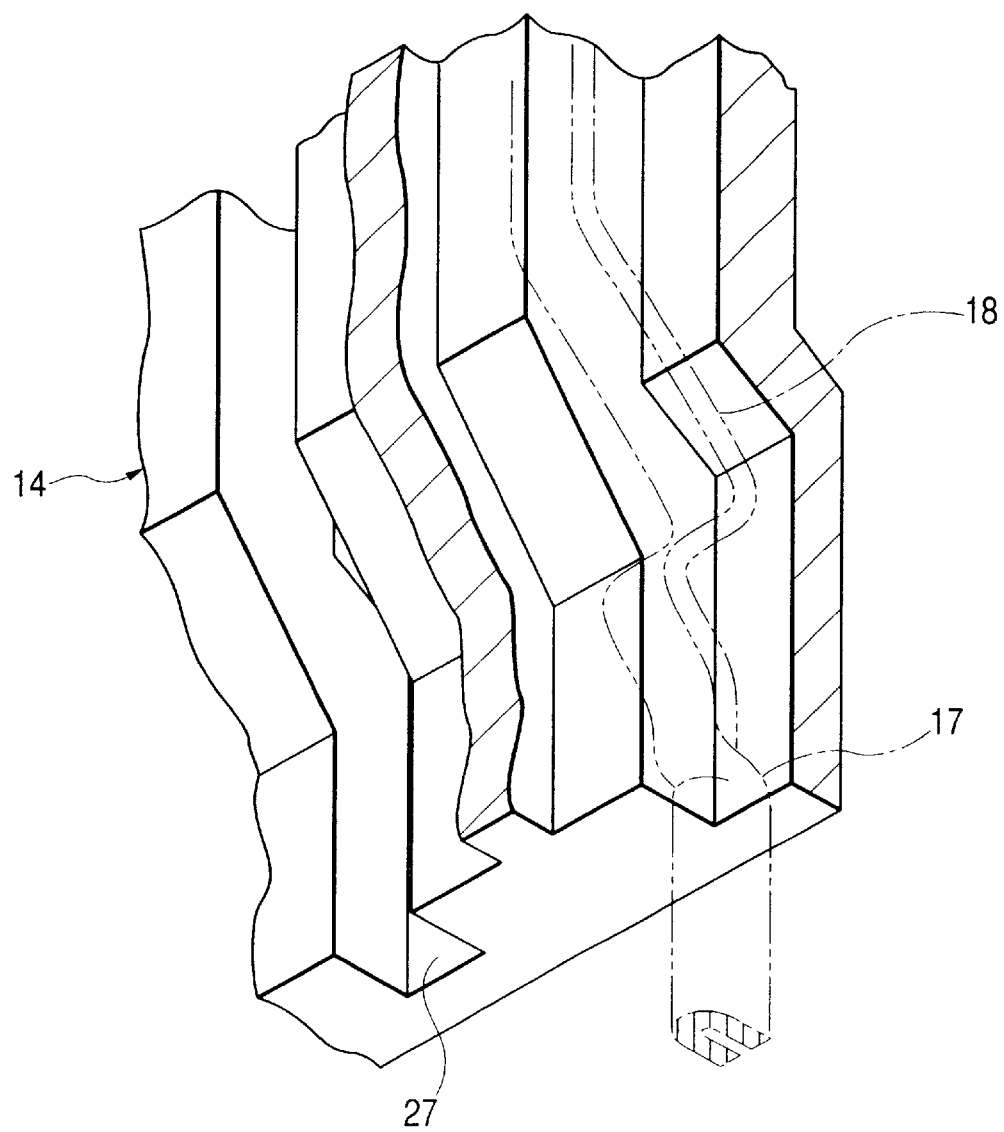
FIG. 5 is an enlarged perspective view of an engaging groove formed in the housing.
Figure 6:
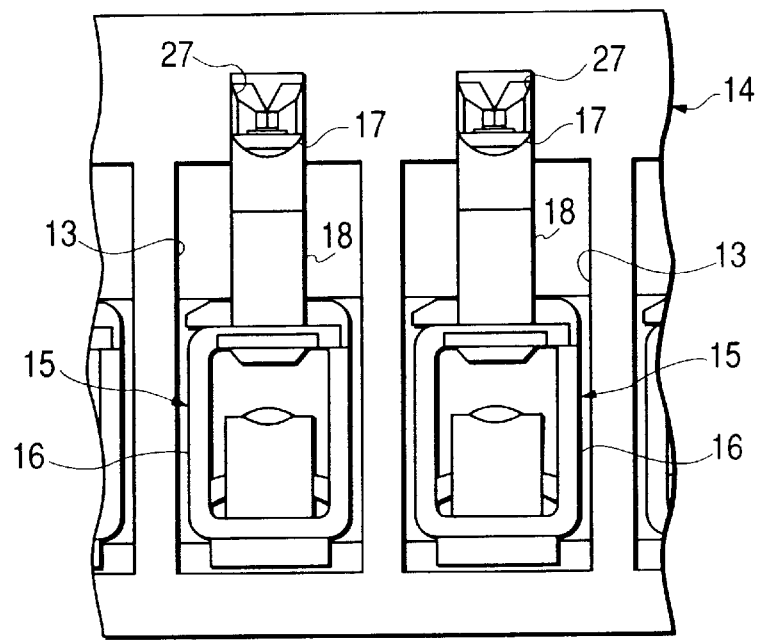
FIG. 6 is a plan view illustrating a state in which a female terminal is accommodated in a terminal accommodating portion.

As shown in FIGS. 4 to 6, many engaging grooves 13 upwardly and downwardly extending and serving as a first adjusting portion are formed in the inner side face portion of the terminal accommodating portion 13. An elastic flexible portion 18 of each of the male terminals is engaged in a corresponding one of the engaging grooves 27, each of which is almost equal in width to the corresponding elastic flexible portion. According to this relation, in a state in which each of the elastic flexible portions 18 is engaged in the corresponding engaging groove 27, both side parts of each of the flexible portions 18 are made to abut against the inner side face of the corresponding engaging groove 27, so that the alignment in the longitudinal (or predetermined) direction of the board connector 12 is adjusted. Moreover, the movement of the board connecting pins 17 in the longitudinal direction of the board connector 12 is regulated.

Figure 7:
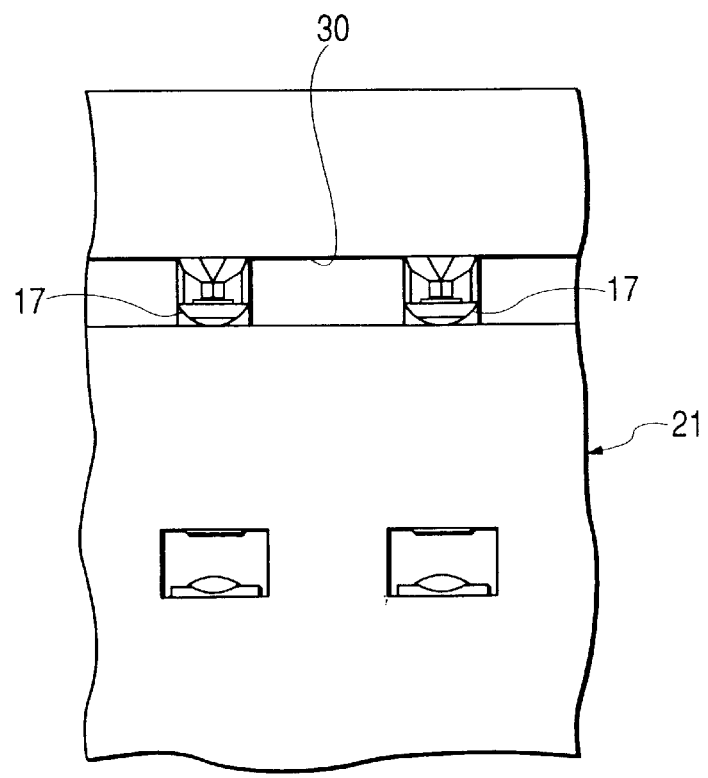
FIG. 7 is a plan view illustrating the retainer having a slot formed therein, in which board connecting pins are inserted.

As shown in FIGS. 3, 4, and 7, a plurality of slits 30 extending in the longitudinal direction of the board connector 12 and serving as second adjusting portions are formed in the bottom surface portion of the retainer 21. Each of the slits 30 is arranged along a line in which the board connecting pins 17 are arranged. The slits 30 are formed in such a manner as to be almost equal in width to the leading end portion of each of the board connecting pins 17. Thus, the alignment in the direction of width of, that is, in a direction orthogonal to the longitudinal direction of the board connector 12 is adjusted by engaging the board connecting pins 17 in the slits 30. The movement of the board connecting pins 17 in the direction of width of the board connector 12 is regulated.

Next, the assembly of the board connector 12 configured as described above will be described below.

First, the housing 14 is set in a position in which the bottom opening portion 14b thereof is turned upwardly. Then, each of the female terminals 15 is inserted into a corresponding one of the terminal accommodating portions 13. Thus, the elastic flexible portion 18, which is a part of each of the board connecting pins 17, is engaged with the corresponding engaging groove 27. The alignment of the board connecting pins 17 in the longitudinal direction of the board connector 12 is forcibly adjusted by this engagement therebetween.

Subsequently, the leading end portion of each of the board connecting pins 17 is inserted into the corresponding slit 30 of the retainer 21. Then, each of the latch projections 23 is engaged with the corresponding latch hole 22 during both the side portions of the retainer 21 are elastically deformed. The retainer 21 is attached to the housing 14 by this engagement therebetween. As a result of this attachment, each of the board connecting pins 17 is inserted into the corresponding slit 30, so that the alignment of the board connecting pins 17 in the direction of width of the board connector 12 is forcibly adjusted.

Thus, the alignment in each of the longitudinal and the direction of width of the board connector 12 is adjusted, so that the leading end portion of each of the board connecting pins 17 is positioned at a regular position. Moreover, even when an external force is exerted on each of the board connecting pins 17, the movement of the board connector 12 in both directions is regulated. Consequently, each of the board connecting pins 17 can be reliably inserted into a corresponding one of the mounting holes 11a of the circuit board 11 when the board connector 12 is incorporated into the circuit board 11.

Therefore, this embodiment can have effects that are described in the following sections (1) to (4), respectively.

(1) The engaging grooves 27 for adjusting the alignment of the board connecting pins 17 in the longitudinal direction of the board connector 12 are formed in the housing 14. Moreover, the retainer 21 is attached to the side face, from which the board connecting pins 17 are projected, of the housing 14. Furthermore, the slits 30 for adjusting the alignment of the board connecting pins 17 in the direction of width of the board connector 12 are formed in the retainer 21. Thus, the board connecting pins 17 can be positioned at regular positions.

(2) Even when the retainer 21 is formed from the material that differs largely from the material of the circuit board 11 in coefficient of thermal expansion, the alignment of the board connecting pins 17 in the longitudinal direction of the retainer 21 is not adjusted. Therefore, even when the retainer 21 contracts and expands owing to heat generated in the external environment and generated by the components mounted on the circuit board, the displacement of the board connecting pins 17 can be avoided. Moreover, because the material of the retainer 21 is soft, the latch projections 23 can be engaged with the latch holes 22 during the retainer 21 is elastically deformed. Therefore, in a state in which the function of adjusting the alignment of the board connecting pins 17 is secured, the retainer 21 can be attached to the housing without being damaged.

(3) The material of the housing 14 mounted on the circuit board 11 by being in contact therewith is PBT-G. Thus, the housing 14 can be made to be almost equal in coefficient of thermal expansion to the circuit board 11. Consequently, the housing 14 can be prevented from expanding and contracting in the longitudinal direction thereof owing to heat generated in the external environment and generated by components mounted on the circuit board. Therefore, the displacement of the board connecting pins 17 can be prevented. Consequently, an occurrence of solder cracks can reliably be prevented.

(4) Because the slits 30 are formed in the retainer 21, the board connecting pins 17 can be inserted into the slits 30 at a time when the retainer 21 is attached to the housing 14. Consequently, the retainer 21 can easily be attached thereto.

Incidentally, the embodiment of the invention may be modified as follows.

Although the material having a coefficient of thermal expansion, which is close to that of the circuit board 11, is employed as that of the housing 14 in the aforementioned embodiment in view of the fact that the housing 14 is mounted on the circuit board 11 by being in contact therewith, it is preferable that a material having a coefficient of thermal expansion, which is close to that of the circuit board 11, is employed as that of the retainer 21 when the retainer 21 is mounted thereon by being in contact therewith. In this case, preferably, the function of adjusting the alignment of the board connecting pins 17 in the longitudinal direction of the board connector 12 is imparted to the retainer 21. Moreover, preferably, the function of adjusting the alignment of the board connecting pins 17 in the direction of width of the board connector 12 is imparted to the housing 14.

Contrary to the case of the aforementioned embodiment, the connector 12 may be configured so that the latch holes 22 are provided in the housing, while the latch projections 23 are provided in the retainer 21.

Although the terminal 15 to be accommodated in each of the terminal accommodating portions 13 of the housing 14 is a female terminal, this female terminal may be changed to a male terminal when the terminals provided in the counterpart housing are male terminals.

Next, technical ideas and effects grasped from the foregoing description of the aforementioned embodiment other than technical ideas described in the appended claims are cited in the following sections (1) to (3).

(1) In the case of an embodiment of the second, fourth or fifth connector of the invention, the housing may be mounted by being in contact with the housing, and may be formed from a hard material whose coefficient of thermal expansion is almost equal to that of thermal expansion of the material of the circuit board.

(2) There is provided another circuit board connector having terminals accommodated in a housing to be fixed to a circuit board, and board connecting portions each including an elastic flexible portion formed on each of the terminals. A leading end portion of each of the board connecting portions, which is projected from the housing, is fixed to the circuit board. This connector comprises a retainer provided on a side face, from which a corresponding one of the board connecting portions is projected, of the housing, a latch projection provided on one of the housing and the retainer, and a latch hole provided in the other of the housing and the retainer. In this connector, the retainer is attached to the housing by engaging the latch projection with the latch hole when the retainer is attached to the housing. A first adjusting portion for adjusting alignment of the board connecting portions in a predetermined direction is provided in the housing. A second adjusting portion for adjusting alignment of the board connecting portions in a direction orthogonal to the predetermined direction is provided in the retainer.

(3) There is provided another circuit board connector having terminals accommodated in a housing to be fixed to a circuit board, and board connecting portions each including an elastic flexible portion formed on each of the terminals. A leading end portion of each of the board connecting portions, which is projected from the housing, is fixed to the circuit board. This connector comprises a retainer attached to a side face, from which a corresponding one of the board connecting portions is projected, of the housing. A first adjusting portion for regulating movement of the board connecting portion in a predetermined direction is provided in the housing. A second adjusting portion for regulating movement of the board connecting portions in a direction orthogonal to the predetermined direction is provided in the retainer.

As was described above in detail, according to the invention, a connector for a circuit board can be assembled by securing the function of adjusting the alignment of the board connecting portion without damaging the housing and the retainer.

What is claimed is:

1. A connector for a circuit board, comprising:
   a housing to be fixed to the circuit board;
   a plurality of terminals accommodated in said housing, each of said terminals having a board connecting portion with an elastic flexible portion, and a leading end of said board connecting portion being projected from said housing and fixed to the circuit board;
   a retainer attached to a surface of said housing from which a corresponding one of said board connecting portions is projected;
   a first adjusting portion disposed in said housing, wherein said first adjusting portion is an engaging groove with which both sides of said elastic flexible portion are engaged in a state where said both sides abut against respective walls of said engaging groove, for adjusting alignment of said board connecting portion in a predetermined direction; and
   a second adjusting portion provided in said retainer, for adjusting alignment of said board connecting portions in a direction orthogonal to the predetermined direction, wherein the second adjusting portion has a width substantially equal to the leading end of said board connecting portion.

2. The connector according to claim 1, wherein one of said housing and said retainer is mounted on the circuit board so as to be in contact with the circuit board, and made of a material whose coefficient of thermal expansion is substantially equal to that of the circuit board.

3. The connector according to claim 1;
   wherein one of said first adjusting portion and said second adjusting portion adjusts alignment of said board connecting portion in a longitudinal direction of a connector body; and
   wherein said one of said housing and said retainer is made of a material whose coefficient of thermal expansion is substantially equal to that of the circuit board.

4. The connector according to claim 1, wherein said second adjusting portion is a slit extending in a longitudinal direction of said retainer.

* * * * *